US012253475B2

(12) United States Patent
Blödt et al.

(10) Patent No.: US 12,253,475 B2
(45) Date of Patent: Mar. 18, 2025

(54) MEASURING DEVICE FOR DETERMINING A DIELECTRIC VALUE

(71) Applicant: Endress+Hauser SE+Co. KG, Maulburg (DE)

(72) Inventors: Thomas Blödt, Steinen (DE); Olaf Textor, Lörrach (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 447 days.

(21) Appl. No.: 17/753,788

(22) PCT Filed: Aug. 20, 2020

(86) PCT No.: PCT/EP2020/073399
§ 371 (c)(1),
(2) Date: Mar. 15, 2022

(87) PCT Pub. No.: WO2021/052706
PCT Pub. Date: Mar. 25, 2021

(65) Prior Publication Data
US 2022/0381703 A1    Dec. 1, 2022

(30) Foreign Application Priority Data
Sep. 16, 2019 (DE) ..................... 10 2019 124 825.6

(51) Int. Cl.
*G01N 22/00* (2006.01)
(52) U.S. Cl.
CPC ................... *G01N 22/00* (2013.01)

(58) Field of Classification Search
CPC ..................................................... G01N 22/00
See application file for complete search history.

(56) References Cited

U.S. PATENT DOCUMENTS 3,703,829 A * 11/1972 Dougherty ............ G01F 23/284
73/304 R
4,757,252 A * 7/1988 Maltby .............. G01R 27/2635
73/304 C
(Continued)

FOREIGN PATENT DOCUMENTS

CN    204479658 U    7/2015
CN    105026899 A    11/2015
(Continued)

*Primary Examiner* — Marcus E Windrich
(74) *Attorney, Agent, or Firm* — Mark A. Logan; Endress+Hauser (USA) Holding, Inc.

(57) ABSTRACT

A measuring device for determining the dielectric value of a medium has at least the following components: a measuring sensor with at least one first electrically conductive electrode and a high-frequency unit which is designed to couple a high-frequency signal at least into the first electrode and determine the dielectric value of the medium using a corresponding reflection signal. The measuring device is characterized in that the first electrode is wound on a measuring rod which can be brought into contact with the medium. By winding the electrode, the measuring sensor can be advantageously configured to be significantly shorter without limiting the sensitivity of the measuring device. In this manner, the measuring device can also be used in the event of constricted installation conditions.

10 Claims, 2 Drawing Sheets

(56) References Cited

U.S. PATENT DOCUMENTS

| | | | |
|---|---|---|---|
| 5,898,308 A * | 4/1999 | Champion | G01N 22/04 |
| | | | 73/304 R |
| 6,619,117 B1 | 9/2003 | Reimelt | |
| 10,830,630 B2 * | 11/2020 | Kesba | G01F 23/284 |
| 2010/0107775 A1 | 5/2010 | Wang et al. | |
| 2016/0283006 A1 * | 9/2016 | Ogura | G01L 1/146 |
| 2021/0270761 A1 * | 9/2021 | Camek | G01R 27/2676 |

FOREIGN PATENT DOCUMENTS

| | | |
|---|---|---|
| DE | 4228737 C2 | 11/1994 |
| DE | 19917618 B4 | 4/2004 |
| DE | 102017116027 A1 | 1/2019 |
| DE | 102017130728 A1 | 6/2019 |
| EP | 0216474 A2 | 4/1987 |
| EP | 0622628 A2 | 11/1994 |
| WO | 2019214924 A1 | 11/2019 |

* cited by examiner

MEASURING DEVICE FOR DETERMINING A DIELECTRIC VALUE

CROSS-REFERENCE TO RELATED APPLICATIONS

The present application is related to and claims the priority benefit of German Patent Application No. 10 2019 124 825.6, filed on Sep. 16, 2019 and International Patent Application No. PCT/EP2020/073399, filed on Aug. 20, 2020, the entire contents of which are incorporated herein by reference.

TECHNICAL FIELD

The invention relates to a measuring device for determining the dielectric value of a filling material.

BACKGROUND

In automation technology, especially in process automation technology, field devices serving to detect and/or modify process variables are frequently used. The measured variable to be determined can, for example, be a fill-level, a flow, a pressure, the temperature, the pH value, the redox potential, a conductivity, or the dielectric value of a medium. To detect the corresponding measured values, the field devices each comprise suitable sensors or are based upon suitable measuring principles. A variety of such field devices are manufactured and marketed by the Endress+Hauser company.

The determination of the dielectric value (also known as "dielectric constant" or "relative permittivity") of filling materials in containers is of particular interest both in solids and in liquid and gaseous fillers, such as propellants, wastewater, or chemicals, since this value can constitute a reliable indicator of impurities, the moisture content, or the composition of substances. Within the scope of the invention, the term, "container," also refers to containers that are not closed, such as basins, lakes, or flowing bodies of water.

In order to determine the dielectric value, the capacitive measuring principle can be used according to the prior art, especially in the case of liquid bulk materials. In this case, the effect is used that the capacitance of a capacitor changes in proportion to the dielectric value of the medium located between the two electrodes of the capacitor.

TDR sensors (TDR is an acronym for "Time Domain Reflectometry") are used to measure the dielectric value. In this measuring principle, the sensor transmits a pulsed high-frequency signal having a frequency between 0.1 GHz and 150 GHz along a conductive measuring sensor and measures the transit time of the pulse until the reflected high-frequency signal is received. In this case, the effect is used that the pulse transit time is dependent upon the dielectric value of the substance surrounding the measuring sensor. The functional principle of TDR sensors is described in, for example, the published patent application EP 0622 628 A2. TDR sensors are sold in numerous designs, e.g., by the company, IMKO Mikromodultechnik GmbH. An advantage of TDR sensors is also that, in addition to the dielectric value being determined, the dielectric loss factor of the substance can, potentially, also be determined.

Moreover, it is also possible to use the TDR principle to determine the dielectric value of a (liquid) medium within a container's interior in a near parasitic manner during its radar-based, fill-level measurement. Here too, corresponding high-frequency signals are guided into the medium via an electrically-conductive measuring sensor. This combined fill-level and dielectricity measurement is described in application document DE 10 2015 117 205 A1. In the case of TDR-based, fill-level measurement, the measuring sensor extends in principle over the entire container height.

Even if only the dielectric value is to be measured, the one, TDR-based, measuring sensor cannot optionally be designed to be significantly more compact, so that a certain minimum signal transit time is ensured and a sufficiently high measurement accuracy thereby achieved. As a result, there is the risk that TDR-based, dielectric-value measuring devices are too bulky for certain installation situations, in case of doubt.

The invention is therefore based upon the aim of providing a compact, dielectric-value measuring device.

SUMMARY

The invention achieves this aim by a measuring device for determining the dielectric value of a medium, comprising the following components:
  a measuring sensor having
    at least one, first, electrically-conductive electrode,
  a high-frequency unit which is designed to couple a high-frequency signal at least into the first electrode and to determine the dielectric value of the medium on the basis of a corresponding reflection signal.

In the context of the invention, the term, "high frequency," generally defines signals between 0.1 GHz up to 200 GHz. Depending upon the measuring range, however, it is advantageous if the high-frequency unit is designed to generate the high-frequency electric signal at a frequency between 0.01 GHz and 10 GHz, and, in particular, between 0.433 GHz and 6 GHz.

According to the invention, the measuring device is characterized in that the first electrode is wound on a measuring rod that can be brought into contact with the medium. This has the advantage that the measuring sensor can thereby be significantly shorter, without the sensitivity of the measuring device being restricted. As a result, the measuring device can also be used in confined installation conditions. The geometry of the measuring rod is not fixedly predefined in this case. The measuring rod can, for example, have a circular or a rectangular cross-section. It is also conceivable that the measuring rod not have a straight axis, but instead that the axis be curved appropriately, depending upon the place of use.

Within the context of the invention, the term, "unit," is understood to mean in principle any electronic circuit that is suitable for its proposed intended purpose. Depending upon the requirement, it can therefore be an analog circuit for generating or processing corresponding analog signals. However, it may also be a digital circuit, such as an FPGA or a storage medium, in interaction with a program. In this case, the program is designed to perform the corresponding method steps or to apply the necessary calculation operations of the respective unit. In this context, various electronic units of the fill-level measuring device in the sense of the invention can potentially also access a common physical memory or be operated by means of the same physical digital circuit.

In principle, it is not specified within the scope of the invention that the measurement principle be determined on the basis of the reflected high-frequency signal of the dielectric value. However, it is particularly expedient to determine the dielectric value by means of one of the TDR measuring principles. In these cases, the high-frequency unit is to be designed to generate the high-frequency signal in a pulsed manner. The measuring sensor within the measuring rod may comprise a second electrode as ground potential with respect to the high-frequency signal. In this case, the second electrode may, for example, have the same geometry as the measuring rod, but with its dimensions reduced accordingly, i.e., for example, rod-shaped, with a round cross-section.

So that the electromagnetic near field of the high-frequency signal can penetrate into the medium with minimal loss, the first electrode must be electrically insulated from the measuring rod. For this purpose, for example, the first electrode can be designed with a correspondingly insulating sheath. However, the measuring rod can also be manufactured for this purpose from a non-electrically-conductive material. In order to amplify the electromagnetic field of the high-frequency signal in the medium, it is advantageous here if the insulating material of the measuring rod has a relative dielectric constant of between 6 and 40.

To protect the measuring rod or the first electrode from environmental influences, such as abrasive media, the measuring rod according to the invention can be provided with a non-electrically-conductive coating. If the measuring rod is manufactured from an insulating material, it is possible in this case for the electrically-insulating coating to have a smaller dielectric constant than the measuring rod, so that a gradient of the dielectric constant, so to speak, ensues from the interior of the measuring sensor outwards. As a result, the penetration of the electromagnetic field of the high-frequency signal into the medium is, in turn, amplified. Accordingly, the coating can consist, for example, of a glass, PTFE, ABS, or a ceramic.

Since the sensitivity of the dielectric value measurement is potentially higher the higher the winding density of the first electrode around the measuring rod is, it is advantageous if the first electrode has a winding density along the measuring rod of at least 2 windings for each wavelength that corresponds to the frequency of the high-frequency signal.

The measuring sensor of the measuring device according to the invention can be expanded in such a way that a third electrode is wound on the measuring rod approximately congruently with the first electrode. In this case, the third electrode is arranged, in relation to the measuring rod, within the first electrode. If the high-frequency unit controls, with the first high-frequency signal, the third electrode in such a way that the phase positions of the high-frequency signal at the first electrode and the third electrode are approximately the same, this has the advantage that the electromagnetic near-field of the high-frequency signal along the first electrode is amplified in the medium, and the sensitivity of the dielectric value measurement is thereby increased. This effect can be used in particular when the third electrode has a greater cross-sectional area than the first electrode. In this context, the cross-sectional area should be at least 10% greater, but a cross-sectional area that is greater by up to 400% is also conceivable. An elongated cross-section is also advantageous in this context.

BRIEF DESCRIPTION OF THE DRAWINGS

The invention is explained in more detail with reference to the following figures. The following are shown.

DETAILED DESCRIPTION

Figure 1:
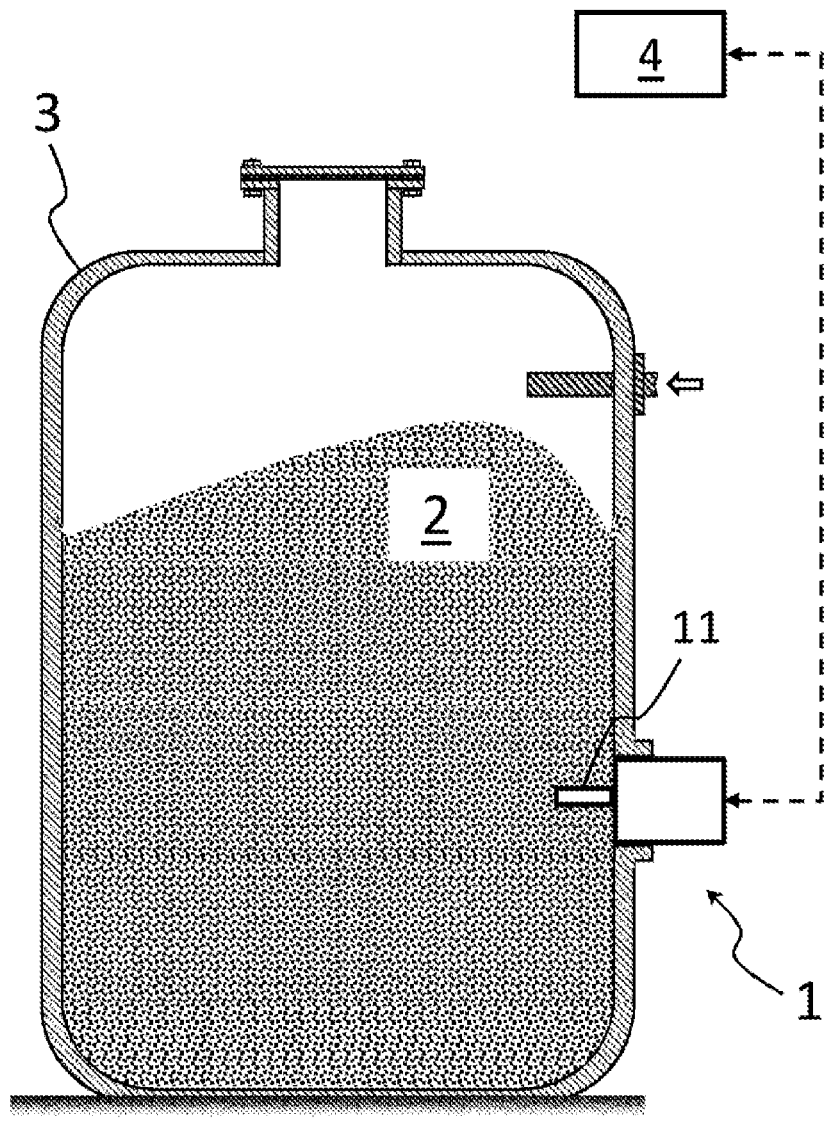
FIG. 1 shows a measuring device according to the invention for the dielectric value measurement of a medium in a container.

For a general understanding of the dielectric measuring device 1 according to the invention, a schematic arrangement of the measuring device 1 on a container 3 with a medium 2 is shown in FIG. 1: To determine the dielectric value of the medium 2, the measuring device 1 is arranged laterally on a connection of the container 2, e.g., a flange connection. For this purpose, the measuring device 1 is attached to the container inner wall approximately in a form-fitting manner. The medium 2 can be liquids, such as beverages, paints, cement, or propellants, like liquid gases or mineral oils. However, the use of the measuring device 1 for bulk-material-type media 2, such as grain for example, is also conceivable.

The measuring device 1 can be connected to a superordinate unit 4, such as, for example, a process control system. A "PROFIBUS," "HART," "wireless HART," or "Ethernet" can, for example, be implemented as an interface. The dielectric value can be transmitted as an absolute value, or a complex value with real part and imaginary part. However, other information about the general operating state of the measuring device 1 can also be communicated.

As shown schematically in FIG. 1, the measuring device 1 according to the invention comprises a measuring sensor 11, which extends, after installation, into the inside of the container 3. In this way, the measuring sensor 11 is in contact with the medium 2 at a corresponding minimum fill-level of the medium 2 so that the measuring device 1 can determine the dielectric value of the medium 2 via the measuring sensor 11.

The mode of operation of the measuring device 1 is based upon a measuring sensor 11, into which a high-frequency signal $s_{HF}$ is applied so that the electromagnetic near-field of the high-frequency signal $s_{HF}$ penetrates the medium 2. For this purpose, the measuring sensor 11 comprises a first, electrically-conductive electrode 111 into which a high-frequency unit of the measuring device 1 can couple the high-frequency signal $s_{HF}$. Based upon a signal $r_{HF}$ reflected accordingly at the end of the first electrode 111, the dielectric value can be determined by the high-frequency unit. The frequency $f_{HF}$ of the high-frequency signal $s_{HF}$ is to be adapted to the specific type of medium 2 or to the specific value range of the dielectric value to be measured. Accordingly, a frequency $f_{HF}$ between 0.433 GHz and 6 GHz is suitable for media 2 having a high water content.

In principle, the measuring principle according to which the dielectric value is determined on the basis of the reflected signal $r_{HF}$ is not specified in the context of the invention. This is because, depending upon the design, the dielectric value can influence the transit time, the amplitude damping, and the phase shift to the transmitted high-frequency signal $s_{HF}$.

In the case of the signal transit time, the FMCW method ("Frequency-Modulated Continuous Wave") or a variant of the TDR method ("Time Domain Reflectometry"), for example, can be implemented analogously to the guided radar.

In the case of FMCW, the high-frequency unit for generating the high-frequency signal $s_{HF}$ can accordingly comprise a "phase-locked loop, PLL." This is based upon a controllable, electrical, high-frequency oscillator (implemented as VCO as standard), which generates the high-frequency electrical signal $s_{HF}$. The frequency of the high-frequency signal $s_{HF}$ in this case is regulated via feedback and is therefore stabilized, on the one hand, against fluctuations in the ambient temperature; on the other hand, the sawtooth frequency change to the high-frequency signal $s_{HF}$, which is typical for FMCW, is set via the feedback: The feedback is realized in that a control signal branches off from the high-frequency signal $s_{HF}$ of the high-frequency oscillator and is fed to a phase comparator. In turn, the phase comparator compares the current phase shift of the control signal $s_c$ with a constant-frequency reference signal. The reference signal here has a precisely pre-settable reference frequency with negligible temperature drift.

In the case of FMCW, the high-frequency unit can determine the transit time and thus the dielectric value, e.g., by mixing the transmitted high-frequency signal $s_{HF}$ with the signal $r_{HF}$ reflected at the end of the first electrode 111, since the frequency of the mixed signal varies linearly with the transit time.

With implementation of the TDR method, the high-frequency unit for cyclical, pulsed generation of the high-frequency signal $s_{HF}$ can, for example, comprise a correspondingly cyclically-controlled oscillator, e.g., in turn, a voltage-controlled oscillator or only a quartz oscillator. To determine the transit time or the dielectric value, the high-frequency unit can process the reflected signal $r_{HF}$ in accordance with the pulse-transit time method by undersampling. As a result of the undersampling, the reflected signal $r_{HF}$ is stretched along the time axis so that the signal maximum corresponding to the signal transit time can be determined in a simplified manner in terms of circuitry.

Despite possible time-stretching, the first electrode 111 must have a defined minimum length so that the high-frequency unit can determine with sufficient resolution the signal transit time of the (reflected) high-frequency signal $s_{HF}$, $r_{HF}$, or the transit time change as a function of various media 2 having various dielectric values. In practice, this results in the measuring sensor 11 needing to have a corresponding minimum length. As a result, however, the measuring device 1 can be too bulky for the respective application, depending upon the installation situation or container size.

Figure 2:
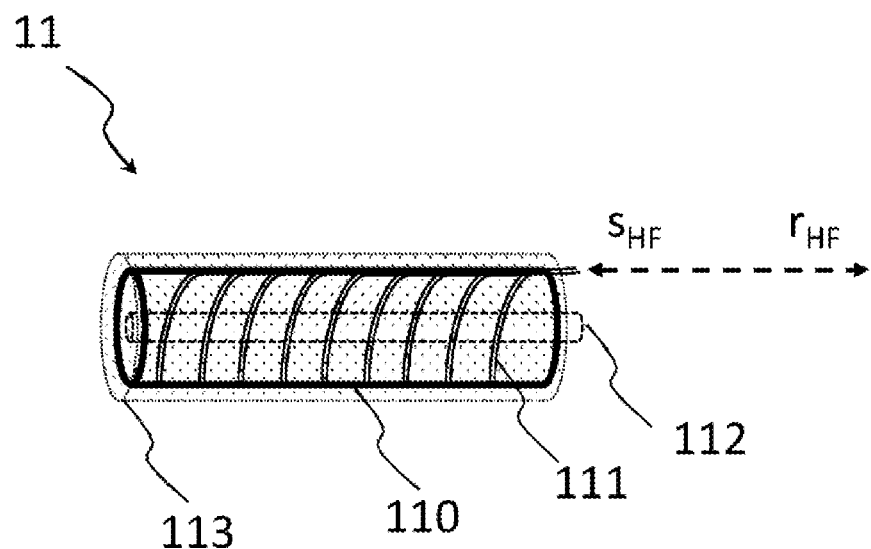
FIG. 2 shows a measuring sensor of the measuring device according to the present disclosure.

On the basis of the measuring sensor 11 according to the invention, as shown in FIG. 2, the measuring device 1 can have a significantly more compact design: As shown, the first electrode 111 is wound for this purpose on a measuring rod 110, wherein the measuring rod 110 is electrically insulated from the first electrode 111. For insulation purposes, the first electrode 111 can be designed, for example, as an encased Cu or Au cable, or the measuring rod 110 can also be made of a non-electrically-conductive material for this purpose.

The higher the winding density of the first electrode 111 around the measuring rod 110, the higher the sensitivity of the dielectric value measurement also potentially is. However, at least the winding density $\#_{min}$ is to be designed such that the first electrode 111 has a winding density $\#_{min}$ along the measuring rod 110 of at least 2 windings for each wavelength $\lambda_{HF}$ that corresponds to the frequency $f_{HF}$ of the high-frequency signal $s_{HF}$ according to:

$$\lambda_{HF} = \frac{c}{f_{HF}}$$

(where c is the propagation velocity of electromagnetic waves at approx. $3*10^8$ m/s). This results, for the minimum winding density $\#_{min}$, in:

$$\#_{min} \sim 2 * \frac{f_{HF}}{c}$$

At a frequency $f_{HF}$ of the high-frequency signal $s_{HF}$ of 1 GHz, the minimum winding density $\#_{min}$ according to this formula thus corresponds to approximately 20 windings per meter.

In the embodiment variant shown in FIG. 2, the measuring rod 110 has a straight axis and a circular cross-section. In general, however, the cross-sectional shape within the scope of the invention is not prescribed fixedly and can also be rectangular, for example. In contrast to the embodiment variant shown, the axis of the measuring rod 110 can also be curved, if this is required by the place of use.

As ground potential with respect to the (reflected) high-frequency signal $s_{HF}$, $r_{HF}$, the measuring electrode 11 in the embodiment variant shown in FIG. 2 comprises a rod-shaped, second electrode 112 with a likewise round cross-section in relation to the cross-section in the circle center of the measuring rod 110, wherein the second electrode 112 is again electrically insulated from the measuring rod 110. In this case, the second electrode 112 is designed to be long enough to extend at least over that region of the measuring rod 110 in which the first electrode 111 is wound on the measuring rod 110.

In the embodiment variant shown in FIG. 2 of the measuring sensor 11, an electrically-insulating coating 113 is applied to the measuring rod 110 or around the first electrode 111. The coating 113 serves primarily to mechanically or chemically protect the first electrode 111 from external influences. In order for the dielectric value of the medium 2 to be examined to still have sufficient influence on the electromagnetic field of the high-frequency signal $s_{HF}$ along the first electrode 111, it is advantageous if the coating 113 has a smaller dielectric constant than the also electrically-insulating measuring rod 110. If the measuring rod 110 is thus made of a material having a relative dielectric constant between 6 and 40 $F*m^{-1}$, the electrically-insulating coating 113 can be produced, for example, from a material, such as glass, PTFE, ABS, or a ceramic, which has a correspondingly smaller relative dielectric constant than the measuring rod 110.

Figure 3:
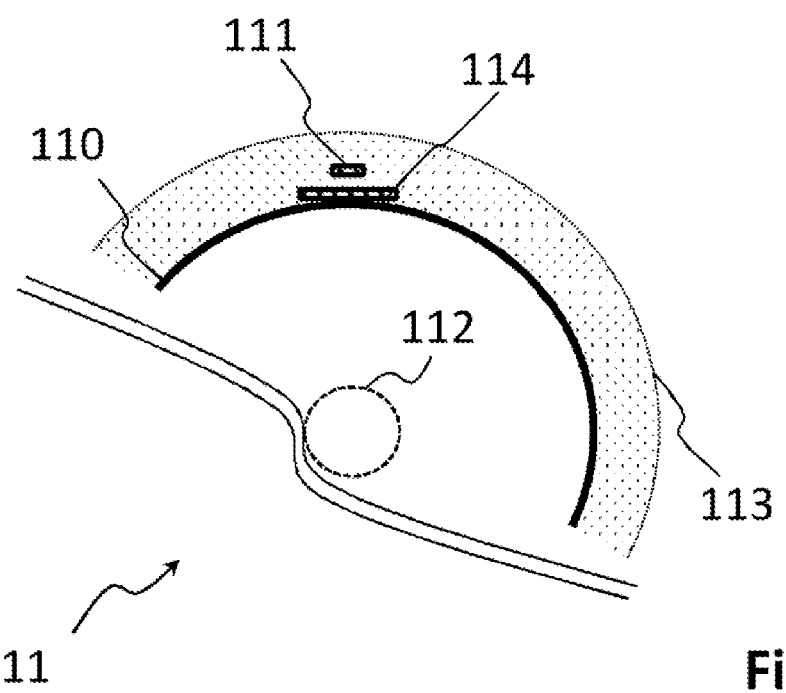
FIG. 3 shows a cross-sectional view of the measuring sensor according to the present disclosure.

FIG. 3 shows a cross-sectional view of the measuring sensor 11 according to the invention: In this view, an expanded embodiment variant is shown in which a third electrode 114 is wound on the measuring rod 110 approximately congruently with the first electrode 111. In this case, the third electrode 114 is arranged, in relation to the measuring rod 110, within the first electrode 111.

In the illustration shown, both the first electrode 111 and the third electrode 114 have an elongate cross-section in relation to the cross-section of the measuring rod 10. In this case, the length and thus the cross-sectional area of the third electrode 114 are approximately 150% greater than the cross-sectional area of the first electrode 111. This embodiment variant of the measuring sensor 11 makes it possible for the electromagnetic field of the high-frequency signal $s_{HF}$ to be applied with increased intensity, along the first electrode 111, to the medium 2 to be examined. As a result, the sensitivity of the measurement can, in turn, be increased. The prerequisite is that the high-frequency unit of the measuring device 1 also apply the high-frequency signal $s_{HF}$ to the third electrode 114, and in fact approximately in-phase with respect to the first electrode 111. The size of the measuring sensor 11 can thus potentially be further reduced by the third electrode 114, without reducing the sensitivity. The sensitivity, or the extent of the measuring region around the measuring sensor 11, can in turn be variably adjusted via the signal strength with which the high-frequency signal $s_{HF}$ is applied into the third electrode 114.

The invention claimed is:

1. A measuring device for determining a dielectric value of a medium, comprising:
   a measuring sensor, including:
      a first electrically conductive electrode;
      a measuring rod;
      a second electrically conductive electrode; and
      a high-frequency unit designed to couple a high-frequency signal into the first electrode and to determine the dielectric value of the medium on the basis of a corresponding reflection signal,
      wherein the first electrode is wound on the measuring rod and can be brought into contact with the medium,
      wherein the second electrode is rod-like and disposed inside the measuring rod and electrically insulated from the measuring rod,
      wherein the second electrode extends along a region of the measuring rod on which the first electrode is wound, and
      wherein the second electrode serves as ground potential for the high-frequency signal or the reflection signal.

2. The measuring device according to claim 1, wherein the high-frequency unit is configured to generate the high-frequency signal in a pulsed manner such that the dielectric value can be determined using a Time Domain Reflectometry measuring principle.

3. The measuring device according to claim 1, wherein the measuring rod has a circular cross-section and wherein the second electrode has a circular cross section.

4. The measuring device according to claim 1, wherein the measuring rod includes an electrically insulating coating.

5. The measuring device according to claim 4, wherein the measuring rod is produced from a non-electrically conductive material having a defined relative dielectric constant of between 6 and 40.

6. The measuring device according to claim 4, wherein the electrically insulating coating has a smaller dielectric constant than the measuring rod and is produced from a glass, PTFE, ABS, or a ceramic.

7. The measuring device according to claim 1, wherein the first electrode has a winding density along the measuring rod of at least 2 windings for each wavelength that corresponds to the frequency of the high-frequency signal.

8. The measuring device according to claim 1,
   wherein the measuring sensor further includes a third electrode wound on the measuring rod,
   wherein the third electrode is coincident with the first electrode and disposed between the measuring rod and the first electrode, and
   wherein the third electrode has a larger cross-sectional area than the first electrode.

9. The measuring device according to claim 8, wherein the high-frequency unit controls, with the high-frequency signal, the third electrode such that the phase positions of the high-frequency signal on the first electrode and the third electrode are the same.

10. The measuring device according to claim 1, wherein the high-frequency unit is designed to generate the high-frequency electric signal at a frequency between 0.1 GHz and 10 GHz.

* * * * *